United States Patent
Kim

(10) Patent No.: US 10,732,469 B2
(45) Date of Patent: *Aug. 4, 2020

(54) LIQUID CRYSTAL DISPLAY DEVICE HAVING IMPROVED ELECTROSTATIC DISCHARGE TOLERANCE

(71) Applicant: Samsung Display Co., Ltd., Yongin-si, Gyeonggi-do (KR)

(72) Inventor: Inwoo Kim, Asan-si (KR)

(73) Assignee: Samsung Display Co., Ltd. (KR)

( * ) Notice: Subject to any disclaimer, the term of this patent is extended or adjusted under 35 U.S.C. 154(b) by 0 days.

This patent is subject to a terminal disclaimer.

(21) Appl. No.: 16/001,209

(22) Filed: Jun. 6, 2018

(65) Prior Publication Data

US 2018/0284550 A1  Oct. 4, 2018

Related U.S. Application Data

(63) Continuation of application No. 15/596,332, filed on May 16, 2017, now Pat. No. 10,018,884.

(30) Foreign Application Priority Data

Jun. 30, 2016 (KR) ........................ 10-2016-0082308

(51) Int. Cl.
  *G02F 1/1362* (2006.01)
  *G02F 1/1333* (2006.01)
  (Continued)

(52) U.S. Cl.
  CPC .. *G02F 1/136204* (2013.01); *G02F 1/133345* (2013.01); *G02F 1/134309* (2013.01);
  (Continued)

(58) Field of Classification Search
  CPC ... G02F 1/136259; G02F 2001/136268; G02F 1/136204; G02F 1/133345;
  (Continued)

(56) References Cited

U.S. PATENT DOCUMENTS 7,700,952 B2  4/2010  Park et al.
10,018,884 B2 *  7/2018  Kim .................... H01L 27/0288
(Continued)

FOREIGN PATENT DOCUMENTS

KR  10-2008-0005680 A  1/2008
KR  10-2008-0019838 A  3/2008
KR  10-2012-0061129 A  6/2012

*Primary Examiner* — Phu Vu
(74) *Attorney, Agent, or Firm* — Innovation Counsel LLP

(57) ABSTRACT

A liquid crystal display ("LCD") device is improved in terms of electrostatic discharge ("ESD") tolerance, the LCD device including: a first substrate and a second substrate spaced apart from each other; a liquid crystal layer between the first substrate and the second substrate; a common line on the first substrate; a common electrode on the second substrate; and a plurality of short-circuit portions between the common line and the common electrode. Each of the plurality of short-circuit portions includes a contact surface contacting the common line, and at least two of the short-circuit portions respectively include contact surfaces having different sizes.

30 Claims, 9 Drawing Sheets

(51) Int. Cl.
*G02F 1/1343* (2006.01)
*G09G 3/36* (2006.01)

(52) U.S. Cl.
CPC ............. *G02F 1/136286* (2013.01); *G02F 2001/136272* (2013.01); *G09G 3/3648* (2013.01)

(58) Field of Classification Search
CPC ......... G02F 1/134309; G02F 1/136286; G02F 2001/13627; G09G 3/3648
See application file for complete search history.

(56) References Cited

U.S. PATENT DOCUMENTS

| | | |
|---|---|---|
| 2012/0098811 A1 | 4/2012 | Park |
| 2014/0139792 A1 | 5/2014 | Zhu |
| 2015/0138466 A1* | 5/2015 | Mori .................... G11C 19/287 349/38 |
| 2015/0303223 A1 | 10/2015 | Cai et al. |
| 2015/0340154 A1 | 11/2015 | Kim et al. |
| 2015/0380349 A1 | 12/2015 | Yan |
| 2017/0285424 A1* | 10/2017 | Kwak ............... G02F 1/136286 |

* cited by examiner

LIQUID CRYSTAL DISPLAY DEVICE HAVING IMPROVED ELECTROSTATIC DISCHARGE TOLERANCE

CROSS-REFERENCE TO RELATED APPLICATION

This application is a continuation of U.S. patent application Ser. No. 15/596,332 filed on May 16, 2017, which claims priority to and the benefit of Korean Patent Application No. 10-2016-0082308 filed in the Korean Intellectual Property Office on Jun. 30, 2016, the entire contents of which are incorporated herein by reference.

BACKGROUND

1. Field

Exemplary embodiments of the invention relate to a liquid crystal display ("LCD") device, and more particularly, to an LCD device improved in terms of electrostatic discharge ("ESD") tolerance.

2. Description of the Related Art

LCD devices are one of most widely used types of flat panel display (FPD) devices. An LCD device includes two substrates including two electrodes respectively formed thereon and a liquid crystal layer interposed therebetween.

Upon applying voltage to the two electrodes, liquid crystal molecules of the liquid crystal layer are rearranged such that an amount of transmitted light is controlled in the LCD device.

An LCD device is completed through several test processes. The test processes include an ESD tolerance evaluation process of LCD devices. In the ESD tolerance evaluation process, ESD is applied designedly to LCD devices. If an LCD device has low ESD tolerance, a thin film transistor ("TFT") of the LCD device may be damaged by the applied ESD.

It is to be understood that this background of the technology section is intended to provide useful background for understanding the technology and as such disclosed herein, the technology background section may include ideas, concepts or recognitions that were not part of what was known or appreciated by those skilled in the pertinent art prior to a corresponding effective filing date of subject matter disclosed herein.

SUMMARY

Exemplary embodiments of the invention are directed to a liquid crystal display ("LCD") device improved in terms of electrostatic discharge ("ESD") tolerance.

According to an exemplary embodiment of the invention, a liquid crystal display device includes: a first substrate and a second substrate spaced apart from each other; a liquid crystal layer between the first substrate and the second substrate; a common line on the first substrate; a common electrode on the second substrate; and a plurality of short-circuit portions between the common line and the common electrode. Each of the plurality of short-circuit portions includes a contact surface contacting the common line, and at least two of the short-circuit portions respectively include contact surfaces having different sizes.

A short-circuit portion adjacent to a corner of the first substrate may include a contact surface having a different size from a size of a contact surface of another short-circuit portion.

The short-circuit portion adjacent to the corner of the first substrate may include a contact surface having a larger size than a size of a contact surface of another short-circuit portion.

The liquid crystal display device may further include an insulating layer among the plurality of short-circuit portions and the common line, the insulating layer defined with a contact hole for connecting the plurality of short-circuit portions and the common line.

The at least two of the short-circuit portions may be connected to the common line through different numbers of contact holes, respectively.

The plurality of short-circuit portions may include: at least one first short-circuit portion more adjacent to a first side of the first substrate than to a second side of the first substrate, the first side and the second side opposing each other; and at least one second short-circuit portion more adjacent to the second side of the first substrate than to the first side of the first substrate.

The liquid crystal display device may further include a data driver connected to a pad unit of the first side of the first substrate.

At least one of two outermost short-circuit portions that are farthest from each other among the plurality of second short-circuit portions may include a contact surface having a different size from a size of a contact surface of another short-circuit portion, except the two outermost short-circuit portions, among the plurality of second short-circuit portions.

The at least one outermost short-circuit portion may include a larger contact surface than the contact surface of the another short-circuit portion.

The liquid crystal display device may further include an insulating layer among the plurality of short-circuit portions and the common line. The insulating layer may be defined with a contact hole for connecting the plurality of short-circuit portions and the common line.

The at least one outermost short-circuit portion may contact the common line through a greater number of contact holes than a number of contact holes through which the another short-circuit portion contacts the common line.

One of the outermost short-circuit portions may intersect an extension line of a first side among sides that define a display area of the first substrate.

Another of the outermost short-circuit portions may intersect an extension line of a second side among the sides that define the display area.

Each of the extension line of the first side of the display area and the extension line of the second side of the display area may intersect the second side of the first substrate.

One of the outermost short-circuit portions may include: a first contact portion between a third side of the sides defining the display area and the second side of the first substrate, the third side facing the second side of the first substrate; and a second contact portion in an area defined by the second side of the first substrate, an extension line of the third side of the display area, the extension line of the first side of the display area, and a fourth side of sides of the first substrate, the fourth side facing the extension line of the first side of the display area.

The first contact portion of the one of the outermost short-circuit portions may include a contact surface having substantially a same size as a size of the contact surface of the another short-circuit portion.

Another of the outermost short-circuit portions may include: a first contact portion between a third side of the sides defining the display area and the second side of the first substrate, the third side facing the second side of the first substrate; and a second contact portion in an area defined by the second side of the first substrate, an extension line of the third side of the display area, the extension line of the second side of the display area, and a fourth side of sides of the first substrate, the fourth side facing the extension line of the second side of the display area.

The first contact portion of the another of the outermost short-circuit portions may include a contact surface having substantially a same size as a size of the contact surface of the another short-circuit portion.

The second short-circuit portions may include a larger contact surface, as disposed more adjacent to opposite end portions of a second side of the first substrate.

The foregoing is illustrative only and is not intended to be in any way limiting. In addition to the illustrative aspects, embodiments, and features described above, further aspects, embodiments, and features will become apparent by reference to the drawings and the following detailed description.

BRIEF DESCRIPTION OF THE DRAWINGS

The above and other features and aspects of the present disclosure of invention will be more clearly understood from the following detailed description taken in conjunction with the accompanying drawings, in which.

DETAILED DESCRIPTION

Figure 1:
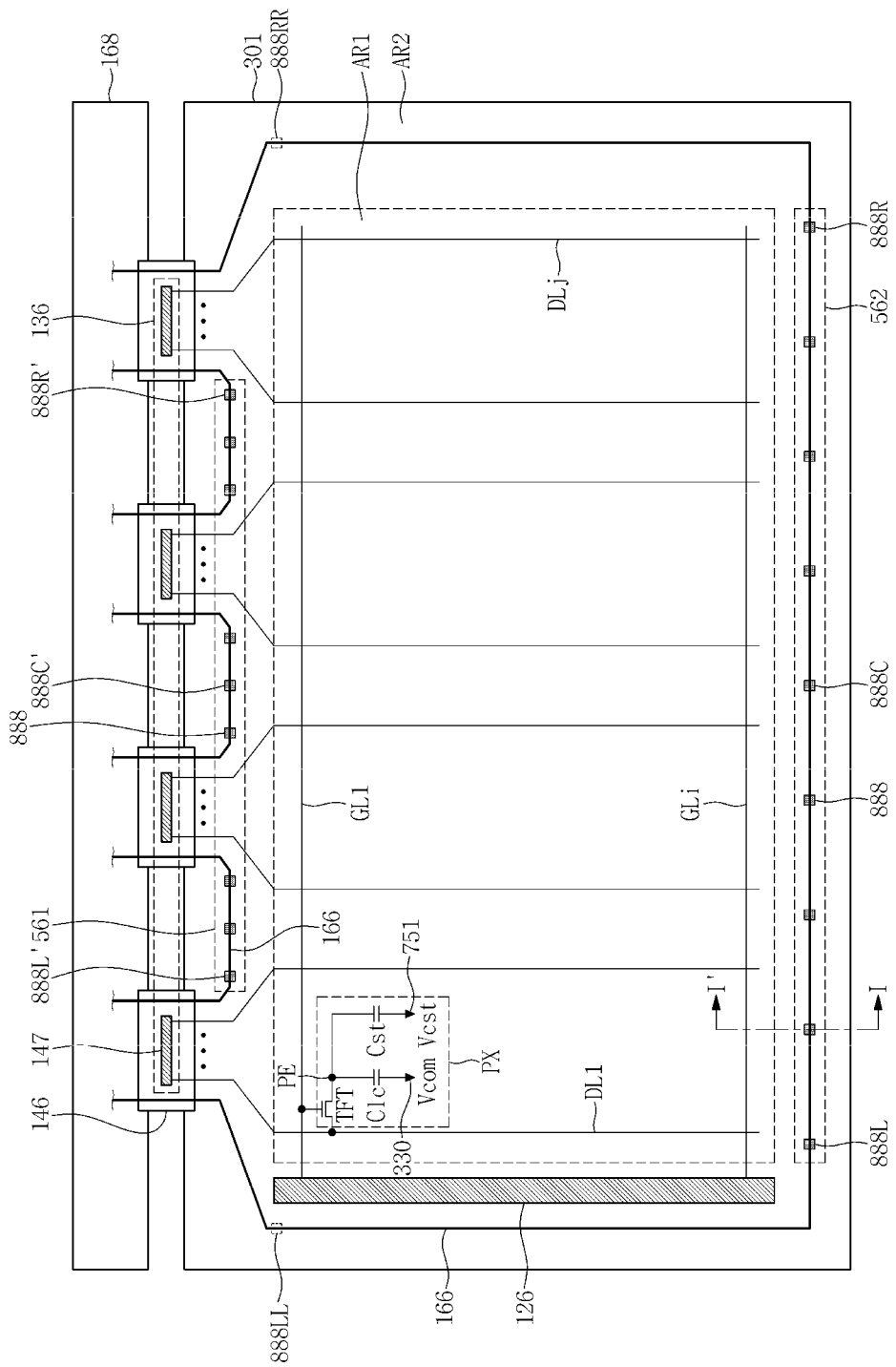
FIG. 1 is a view illustrating an exemplary embodiment of a liquid crystal display (LCD) device.

Advantages and features of the invention and methods for achieving them will be made clear from exemplary embodiments described below in detail with reference to the accompanying drawings. The invention may, however, be embodied in many different forms and should not be construed as being limited to the exemplary embodiments set forth herein. Rather, these exemplary embodiments are provided so that this disclosure will be thorough and complete, and will fully convey the scope of the invention to those skilled in the art. The invention is merely defined by the scope of the claims. Therefore, well-known constituent elements, operations and techniques are not described in detail in the exemplary embodiments in order to prevent the invention from being obscurely interpreted. Like reference numerals refer to like elements throughout the specification.

In the drawings, certain elements or shapes may be illustrated in an enlarged manner or in a simplified manner to better illustrate the invention, and other elements present in an actual product may also be omitted. Thus, the drawings are intended to facilitate the understanding of the present invention.

When a layer, area, or plate is referred to as being "on" another layer, area, or plate, it may be directly on the other layer, area, or plate, or intervening layers, areas, or plates may be present therebetween. Conversely, when a layer, area, or plate is referred to as being "directly on" another layer, area, or plate, intervening layers, areas, or plates may be absent therebetween. Further when a layer, area, or plate is referred to as being "below" another layer, area, or plate, it may be directly below the other layer, area, or plate, or intervening layers, areas, or plates may be present therebetween. Conversely, when a layer, area, or plate is referred to as being "directly below" another layer, area, or plate, intervening layers, areas, or plates may be absent therebetween.

The spatially relative terms "below", "beneath", "less", "above", "upper", and the like, may be used herein for ease of description to describe the relations between one element or component and another element or component as illustrated in the drawings. It will be understood that the spatially relative terms are intended to encompass different orientations of the device in use or operation, in addition to the orientation depicted in the drawings. For example, In a case where a device shown in the drawing is turned over, the device positioned "below" or "beneath" another device may be placed "above" another device. Accordingly, the illustrative term "below" may include both the lower and upper positions. The device may also be oriented in the other direction, and thus the spatially relative terms may be interpreted differently depending on the orientations.

Throughout the specification, when an element is referred to as being "connected" to another element, the element is "directly connected" to the other element, or "electrically connected" to the other element with one or more intervening elements interposed therebetween. It will be further understood that the terms "comprises," "comprising," "includes" and/or "including," when used in this specification, specify the presence of stated features, integers, steps, operations, elements, and/or components, but do not preclude the presence or addition of one or more other features, integers, steps, operations, elements, components, and/or groups thereof.

It will be understood that, although the terms "first," "second," "third," and the like may be used herein to describe various elements, these elements should not be limited by these terms. These terms are only used to distinguish one element from another element. Thus, "a first element" discussed below could be termed "a second element" or "a third element," and "a second element" and "a third element" can be termed likewise without departing from the teachings herein.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, 20%, 10%, 5% of the stated value.

Unless otherwise defined, all terms used herein (including technical and scientific terms) have a same meaning as commonly understood by those skilled in the art to which this invention pertains. It will be further understood that terms, such as those defined in commonly used dictionaries, should be interpreted as having a meaning that is consistent with their meaning in the context of the relevant art and will not be interpreted in an ideal or excessively formal sense unless clearly defined in the present specification.

Hereinafter, an exemplary embodiment of a liquid crystal display ("LCD") device will be described in detail with reference to FIGS. 1 to 11.

Figure 2:
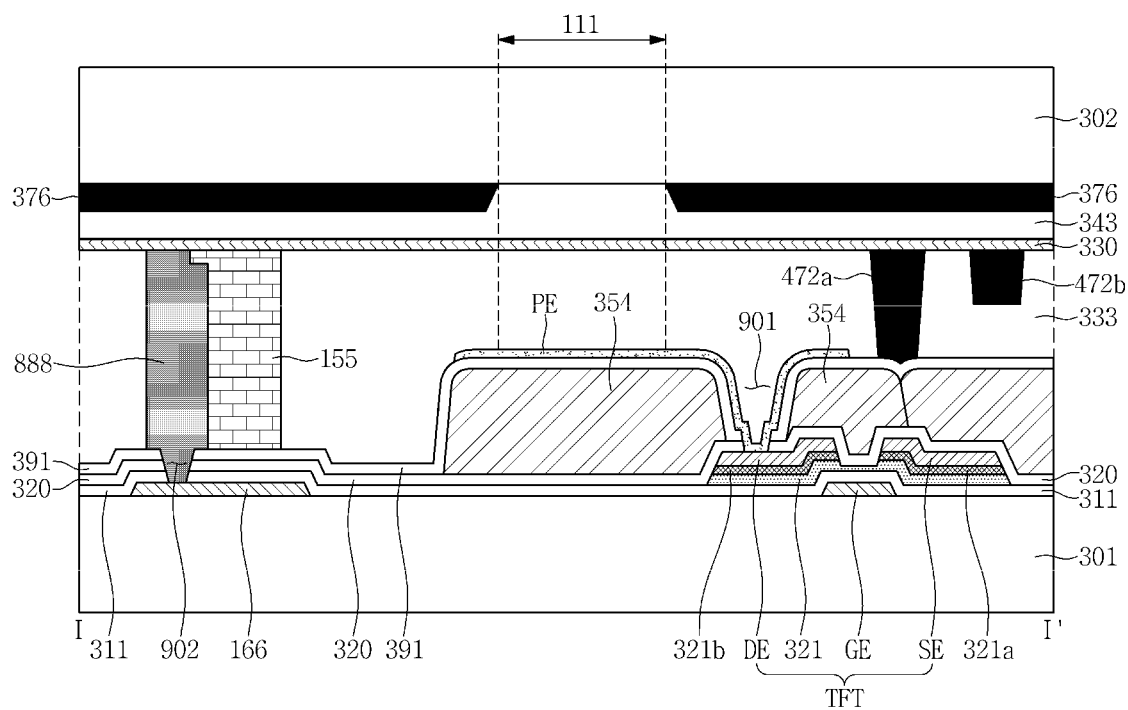
FIG. 2 is a cross-sectional view taken along line I-I' of FIG. 1.

FIG. 1 is a view illustrating an exemplary embodiment of an LCD device, and FIG. 2 is a cross-sectional view taken along line I-I' of FIG. 1.

As illustrated in FIGS. 1 and 2, an exemplary embodiment of an LCD device includes a first substrate 301, a second substrate 302, a liquid crystal layer 333, a data driver 136, a gate driver 126, and a circuit board 168.

The first substrate 301 has a display area AR1 and a non-display area AR2. The non-display area AR2 surrounds the display area AR1.

A plurality of gate lines GL1 to GLi, a plurality of data lines DL1 to DLj, and a plurality of pixels PX are disposed in the display area AR1 of the first substrate 301.

The gate lines GL1 to GLi extend to the non-display area AR2 to be connected to the gate driver 126.

The gate lines GL1 to GLi are driven by the gate driver 126. As illustrated in FIG. 1, the gate driver 126 may be disposed in the non-display area AR2 of the first substrate 301. For example, the gate driver 126 may be disposed in the non-display area AR2 between a common line 166 and the display area AR1. Although not illustrated, the gate driver 126 overlaps a light blocking layer 376.

The data lines DL1 to DLj intersect the gate lines GL1 to GLi. The data lines DL1 to DLj extend to the non-display area AR2 to be connected to the data driver 136.

The data driver 136 includes a plurality of data driving integrated circuits 147. The data driving integrated circuits 147 receive digital image data signals and a data control signal from a timing controller. The data driving integrated circuits 147 sample the digital image data signals according to the data control signal, latch the sampled image data signals corresponding to one horizontal line in each horizontal period, and apply the latched image data signals to the data lines DL1 to DLj. That is, the data driving integrated circuits 147 convert the digital image data signals applied from the timing controller into analog image signals using a gamma voltage input from a power supply (not illustrated) and apply the converted analog image signals to the data lines DL1 to DLj.

Each of the data driving integrated circuits 147 is mounted on a data carrier 146. The data carriers 146 are connected between the circuit board 168 and the first substrate 301. For example, each of the data carriers 146 may be electrically connected between the circuit board 168 and the non-display area AR2 of the first substrate 301. The data carrier 146 may be a data tape carrier package.

The aforementioned timing controller and the power supply may be disposed on the circuit board 168, and the data carrier 146 includes input wirings which transmit various signals applied from the timing controller and the power supply to the data driving integrated circuits 147 and output wirings which transmit image data signals output from the data driving integrated circuits 147 to corresponding ones of the data lines DL1 to DLj. In an exemplary embodiment, at least one carrier 146 may further include auxiliary wirings that may transmit various signals applied from the timing controller and the power supply to the gate driver 236, and the auxiliary wirings are connected to panel wirings on the first substrate 301. The panel wirings connect the auxiliary wirings and the gate driver 126 to one another. The panel wirings may be disposed in the non-display area AR2 of the first substrate 301 in a line-on-glass manner.

As illustrated in FIG. 1, the common line 166 is disposed in the non-display area AR2 of the first substrate 301. The common line 166 may have a shape surrounding the display area AR1. For example, a portion of the common line 166 may be disposed in the non-display area AR2 between the display area AR1 and a left side of the first substrate 301, another portion of the common line 166 may be disposed in the non-display area AR2 between the display area AR1 and a right side of the first substrate 301, another portion of the common line 166 may be disposed in the non-display area AR2 between the display area AR1 and an upper side of the first substrate 301, and another portion of the common line 166 may be disposed in the non-display area AR2 between the display area AR1 and a lower side of the first substrate 301.

The common line 166 receives a common voltage Vcom from the aforementioned power supply. To this end, the common line 166 may be connected to the power supply through a signal transmission line on the data carrier 146.

The plurality of pixels PX are disposed in the display area AR1. The pixels PX are arranged in a matrix form. The pixels PX may include a red pixel displaying a red image, a green pixel displaying a green image, and a blue pixel displaying a blue image. In such an exemplary embodiment, a red pixel, a green pixel, and a blue pixel that are disposed adjacent to one another may define a unit pixel for displaying a unit image. The unit pixel may further include a white pixel displaying a white color.

There are "j" number of pixels PX arranged along an n-th (n is one selected from 1 to i) horizontal line (hereinafter, n-th horizontal line pixels), which are connected to the first to j-th data lines DL1 to DLj, respectively. Further, the n-th horizontal line pixels are connected to the n-th gate line in common. Accordingly, the n-th horizontal line pixels receive an n-th gate signal as a common signal. That is, "j" number of pixels disposed in a same horizontal line receive a same gate signal, while pixels disposed in different horizontal lines receive different gate signals, respectively.

Each of the pixels PX includes a pixel electrode PE, a switching element TFT, a liquid crystal capacitor Clc, and a storage capacitor Cst.

The switching element TFT is connected to the gate line GL1, the data line DL1, and the pixel electrode PE. For example, a gate electrode of the switching element TFT is connected to the gate line GL1, a source electrode of the switching element TFT is connected to the data line DL1, and a drain electrode of the switching element TFT is connected to the pixel electrode PE. The switching element TFT may be a thin film transistor ("TFT").

The switching element TFT is controlled according to a gate signal applied from the gate line GL1, and is connected between the data line DL1 and the pixel electrode PE. The switching element TFT is turned on by a gate high voltage of the gate signal applied from the gate line GL1, and when turned on, applies the image data voltage applied from the data line DL1 to the pixel electrode PE. In an exemplary embodiment, the switching element TFT is turned off by a gate low voltage of the gate signal applied from the gate line GL1.

The liquid crystal capacitor Clc is formed between the pixel electrode PE and a common electrode 330. The liquid crystal capacitor Clc includes a first electrode connected to the pixel electrode PE, a second electrode connected to the common electrode 330, and a liquid crystal layer between the first electrode and the second electrode. The first electrode of the liquid crystal capacitor Clc may be a portion of the pixel electrode PE, and the second electrode of the liquid crystal capacitor Clc may be a portion of the common electrode 330. A common voltage Vcom is applied to the common electrode 330.

The storage capacitor Cst is formed between the pixel electrode PE and a storage electrode 751. The storage capacitor Cst includes a first electrode connected to the pixel electrode PE, a second electrode connected to the storage electrode 751, and a dielectric material between the first electrode of the storage capacitor Cst and the second electrode of the storage capacitor Cst. The dielectric material includes at least one insulating layer. The first electrode of the storage capacitor Cst may be a portion of the pixel electrode PE, and the second electrode of the storage capacitor Cst may be a portion of the storage electrode 751. A storage voltage Vcst is applied to the storage electrode 751. The storage voltage Vcst may have an equal voltage level as that of the common voltage Vcom.

The liquid crystal layer 333 is disposed between the first substrate 301 and the second substrate 302. The liquid crystal layer 333 may include liquid crystal molecules having negative dielectric anisotropy and aligned vertically. Alternatively, the liquid crystal layer 333 may include a photopolymerizable material, and such a photopolymerizable material may be a reactive monomer or a reactive mesogen.

As illustrated in FIG. 2, the gate electrode GE and the common line 166 are disposed on the first substrate 301. The gate electrode GE may have a shape protruding from the gate line. The gate electrode GE and the gate line may be unitary. The gate electrode GE may be a portion of the gate line.

At least one of the gate electrode GE and the common line 166 may include or be formed of aluminum (Al) or alloys thereof, silver (Ag) or alloys thereof, copper (Cu) or alloys thereof, and/or molybdenum (Mo) or alloys thereof. In an alternative exemplary embodiment, at least one of the gate electrode GE and the common line 166 may include or be formed of one of chromium (Cr), tantalum (Ta), and titanium (Ti). In an alternative exemplary embodiment, at least one of the gate line GL, the gate electrode GE and the common line 166 may have a multilayer structure including at least two conductive layers that have different physical properties from one another.

As illustrated in FIG. 2, a gate insulating layer 311 is disposed on the gate electrode GE and the common line 166. The gate insulating layer 311 may be disposed over an entire surface of the first substrate 301 including the gate electrode GE and the common line 166. As illustrated in FIG. 2, the gate insulating layer 311 is defined with a hole (hereinafter, a first hole) defined on the common line 166.

The gate insulating layer 311 may include or be formed of silicon nitride (SiNx) or silicon oxide (SiOx). The gate insulating layer 311 may have a multilayer structure including at least two insulating layers having different physical properties.

A semiconductor layer 321 is disposed on the gate insulating layer 311. The semiconductor layer 321 overlaps the gate electrode GE, the source electrode SE, and the drain electrode DE. The semiconductor layer 321 may include amorphous silicon, polycrystalline silicon, or the like.

The source electrode SE is disposed on the semiconductor layer 321. Although not illustrated, the source electrode SE may further be disposed on the gate insulating layer 311. The source electrode SE overlaps the semiconductor layer 321 and the gate electrode GE. The source electrode SE may have a shape protruding from the data line. The source electrode SE and the data line may be unitary. The source electrode SE may be a portion of the data line.

The source electrode SE may include or be formed of refractory metal, such as molybdenum, chromium, tantalum, and titanium, or an alloy thereof, and may have a multilayer structure including a refractory metal layer and a low-resistance conductive layer. Examples of the multilayer structure may include: a double-layer structure including a chromium or molybdenum (alloy) lower layer and an aluminum (alloy) upper layer; and a triple-layer structure including a molybdenum (alloy) lower layer, an aluminum (alloy) intermediate layer, and a molybdenum (alloy) upper layer. In an alternative exemplary embodiment, the source electrode SE may include or be formed of any suitable metals or conductors rather than the aforementioned materials.

The drain electrode DE is disposed on the semiconductor layer 321, spaced apart from the source electrode SE at a predetermined distance. Although not illustrated, the drain electrode DE may further be disposed on the gate insulating layer 311. The drain electrode DE overlaps the semiconductor layer 321 and the gate electrode GE. A channel area of the switching element TFT is disposed between the drain electrode DE and the source electrode SE. The drain electrode DE may include substantially a same material and have substantially a same structure (a multilayer structure) as those of the source electrode SE. The drain electrode DE and the source electrode SE may be simultaneously provided in substantially a same process.

The switching element TFT may further include a first ohmic contact layer 321a and a second ohmic contact layer 321b.

The first ohmic contact layer 321a is disposed between the semiconductor layer 321 and the source electrode SE. The first ohmic contact layer 321a reduces an interfacial resistance between the semiconductor layer 321 and the source electrode SE.

The first ohmic contact layer 321a may include silicide or n+ hydrogenated amorphous silicon doped with n-type impurities, e.g., phosphorus (P) or phosphine ($PH_3$), at high concentration.

The second ohmic contact layer 321b is disposed between the semiconductor layer 321 and the drain electrode DE. The second ohmic contact layer 321b reduces an interfacial resistance between the semiconductor layer 321 and the drain electrode DE. The second ohmic contact layer 321b may include substantially a same material and have substantially a same structure (a multilayer structure) as those of the first ohmic contact layer 321a. The first ohmic contact layer 321a and the second ohmic contact layer 321b may be simultaneously provided in substantially a same process.

Although not illustrated, the semiconductor layer 321 may further be disposed between the gate insulating layer 311 and the source electrode SE. In addition, the semiconductor layer 321 may further be disposed between the gate insulating layer 311 and the drain electrode DE. Herein, the semiconductor layer between the gate insulating layer 311 and the source electrode SE is defined as a first additional semiconductor layer, and the semiconductor layer between the gate insulating layer 311 and the drain electrode DE is defined as a second additional semiconductor layer. In such an exemplary embodiment, the aforementioned first ohmic contact layer 321a may further be disposed between the first additional semiconductor layer and the source electrode SE, and the aforementioned second ohmic contact layer 321b may further be disposed between the second additional semiconductor layer and the drain electrode DE.

In addition, although not illustrated, the semiconductor layer 321 may further be disposed between the gate insulating layer 311 and the data line. Herein, the semiconductor layer between the gate insulating layer 311 and the data line is defined as a third additional semiconductor layer. In such an exemplary embodiment, the aforementioned first ohmic contact layer 321a may further be disposed between the third additional semiconductor layer and the data line.

A passivation layer 320 is disposed on the source electrode SE, the drain electrode DE, and the gate insulating layer 311. The passivation layer 320 may be disposed over an entire surface of the first substrate 301 including the source electrode SE, the drain electrode DE, and the gate insulating layer 311. The passivation layer 320 is defined with a hole (hereinafter, a second hole) on the drain electrode DE. In addition, the passivation layer 320 is defined with a hole (hereinafter, a third hole) above the aforementioned first hole.

The passivation layer 320 may include an inorganic insulating material such as silicon nitride ($SiN_x$) or silicon oxide ($SiO_x$), and in such an exemplary embodiment, an inorganic insulating material having photosensitivity and having a dielectric constant of about 4.0 may be used. In an alternative exemplary embodiment, the passivation layer 320 may have a double-layer structure including a lower inorganic layer and an upper organic layer. The passivation layer 320 may have a thickness greater than or equal to about 5000 Å, e.g., in a range of about 6000 Å to about 8000 Å.

A color filter 354 is disposed vertically on the passivation layer 320. The color filter 354 is disposed horizontally corresponding to a light emission area 111 of the pixel PX. In such an exemplary embodiment, a portion of the color filter 354 may further extend outwardly of the light emission area 111 to be disposed in a light blocking area. For example, an edge portion of the color filter 354 may be disposed in the light blocking area. The edge portion of the color filter 354 in the light blocking area may vertically overlap the drain electrode DE. The color filter 354 is defined with a hole (hereinafter, a fourth hole) above the aforementioned second hole.

A capping layer 391 is disposed on the color filter 354 and the passivation layer 320. The capping layer 391 prevents dyes of the color filter 354 from being dispersed to the liquid crystal layer 333. The capping layer 391 is defined with a hole (hereinafter, a fifth hole) above the aforementioned fourth hole. In addition, the capping layer 391 is defined with a sixth hole above the third hole. The capping layer 391 may include or be formed of silicon nitride ($SiN_x$), silicon oxide ($SiO_x$), or the like.

The pixel electrode PE is disposed vertically on the capping layer 391. The pixel electrode PE is disposed horizontally corresponding to the light emission area 111. A portion of the pixel electrode PE extends outwardly of the light emission area 111 to be disposed in the light blocking area. For example, an edge portion of the pixel electrode PE is disposed in the light blocking area. The pixel electrode PE is connected to the drain electrode DE through a drain contact hole 901. In other words, the pixel electrode PE is connected to the drain electrode DE through the drain contact hole 901 in the light blocking area. The drain contact hole 901 includes the second hole, the fourth hole, and the fifth hole.

The pixel electrode PE may include or be formed of a transparent conductive material, such as indium tin oxide (ITO) or indium zinc oxide (IZO). Herein, ITO may be a polycrystalline or monocrystalline material, and IZO may be a polycrystalline or monocrystalline material as well. In an alternative exemplary embodiment, IZO may be an amorphous material.

A light blocking layer 376 is disposed on the second substrate 302. The light blocking layer 376 defines the light emission area 111 of the pixel PX. The light blocking layer 376 prevents light from being emitted through an area (i.e., the light blocking area) rather than the light emission area 111. To this end, the light blocking layer 376 is disposed in the light blocking area. For example, the light blocking layer 376 is disposed on the second substrate 302 corresponding to the light blocking area.

An overcoat layer 343 is disposed on the light blocking layer 376 and the second substrate 302. The overcoat layer 343 significantly reduces (e.g., minimizes) a height difference between the light blocking layer 376 and the second substrate 302. In other words, the overcoat layer 343 planarizes the second substrate 302. The overcoat layer 343 may include an organic-layer material.

The common electrode 330 is disposed on the overcoat layer 343. The common electrode 330 may include or be formed or substantially a same material as a material included in the pixel electrode PE. In an exemplary embodiment, when the pixel electrode PE includes IZO, the common electrode 330 may include ITO.

A main column spacer 472a and a sub-column spacer 472b are disposed on the common electrode 330. The main column spacer 472a has a greater thickness than a thickness of the sub-column spacer 472b.

As illustrated in FIG. 1, a short-circuit portion 888 is disposed on the common line 330. An exemplary embodiment of an LCD device may include at least two short-circuit portions 888, and an LCD device including eighteen short-circuit portions 888 is illustrated in FIG. 1 by way of example.

Nine adjacent short-circuit portions (hereinafter, a first short-circuit portion unit 561) among the eighteen short-circuit portions 888 are disposed between an upper side of the first substrate 301 and the display area AR1, and another nine adjacent short-circuit portions (hereinafter, a second short-circuit portion unit 562) among the eighteen short-circuit portions 888 are disposed between a lower side of the first substrate 301 and the display area AR1. The nine short-circuit portions 888 included in the first short-circuit portion unit 561 are disposed more adjacent to the upper side of the first substrate 301 than they are to the lower side of the first substrate 301, and the nine short-circuit portions 888 included in the second short-circuit portion unit 562 are disposed more adjacent to the lower side of the first substrate 301 than they are to the upper side of the first substrate 301.

As illustrated in FIG. 2, the short-circuit portion 888 is disposed between the common line 166 and the common electrode 330. One side of the short-circuit portion 888 contacts the common line 166, and another side of the short-circuit portion 888 contacts the common electrode 330. The one side of the short-circuit portion 888 contacts the common line 166 through a common contact hole 902. The common contact hole 902 includes the first hole, the third hole, and the sixth hole. Herein, a portion of the short-circuit portion 888 that contacts the common line 166 is to be defined as a contact surface of the short-circuit portion 888.

At least two of the plurality of short-circuit portions 888 may have contact surfaces of different sizes, respectively. In other words, at least two of the plurality of short-circuit portions 888 may respectively have contact surfaces having different areas (contact areas). For example, a contact surface of one of the plurality of short-circuit portions 888 that is adjacent to a corner of the first substrate 301 may have a different size from a size of a contact surface of another of the plurality of short-circuit portions 888. For example, a contact surface of one of the plurality of short-circuit portions 888 that is adjacent to each corner of the first substrate 301 may have a greater size than a size of a contact surface of another of the plurality of short-circuit portions 888. For example, a contact surface of one of the plurality of short-circuit portions 888 that is adjacent to each corner of the first substrate 301 may have a size of about 1.2 times to about 2 times a size of a contact surface of another of the plurality of short-circuit portions 888.

The above example will further be described with reference to FIG. 1. First, two short-circuit portions that are disposed farthest from each other among the nine short-circuit portions 888 included in the second short-circuit portion unit 562 are defined as a first outermost short-circuit portion 888L and a second outermost short-circuit portion 888R, respectively. In such an exemplary embodiment, at least one of the first outermost short-circuit portion 888L and the second outermost short-circuit portion 888R may have a contact surface having a different size from sizes of contact surfaces of the other short-circuit portions except the two outermost short-circuit portions 888L and 888R. For example, the contact surface of the first outermost short-circuit portion 888L may be larger than a contact surface of one short-circuit portion (e.g., a short-circuit portion 888C) of the other short-circuit portions. In other words, an area of a contact surface between the first outermost short-circuit portion 888L and the common line 166 may be larger than an area of a contact surface between the short-circuit portion 888C and the common line 166. In addition, the contact surface of the second short-circuit portion 888R may be larger than the contact surface of the short-circuit portion 888C. In other words, an area of a contact surface between the second outermost short-circuit portion 888R and the common line 166 may be larger than the area of the contact surface between the short-circuit portion 888C and the common line 166. In an exemplary embodiment, the contact surface of the first outermost short-circuit portion 888L may have substantially a same size as a size of the contact surface of the second outermost short-circuit portion 888R.

Similarly, two short-circuit portions that are disposed farthest from each other among the nine short-circuit portions 888 included in the first short-circuit portion unit 561 are defined as a first outermost short-circuit portion 888L' and a second outermost short-circuit portion 888R', respectively. In such an exemplary embodiment, at least one of the first outermost short-circuit portion 888L' and the second outermost short-circuit portion 888R' may have a contact surface having a different size from sizes of contact surfaces of the other short-circuit portions except the two outermost short-circuit portions 888L' and 888R'. For example, the contact surfaces of the first outermost short-circuit portion 888L' and the contact surface of the second outermost short-circuit portion 888R' may be larger than a contact surface of one short-circuit portion (e.g., a short-circuit portion 888C') of the other short-circuit portions.

The first outermost short-circuit portion 888L' of the first short-circuit portion unit 561, the second outermost short-circuit portion 888R' of the first short-circuit portion unit 561, the first outermost short-circuit portion 888L of the second short-circuit portion unit 562, and the second outermost short-circuit portion 888R of the second short-circuit portion unit 562 may each have contact surfaces of substantially a same size. In addition, the other short-circuit portions except the aforementioned outermost short-circuit portions 888L, 888R, 888L', and 888R' may each have contact surfaces of substantially a same size. Each of the other short-circuit portions has a smaller contact surface than the contact surfaces of the aforementioned outermost short-circuit portions 888L, 888R, 888L', and 888R'.

An exemplary embodiment of an LCD device, as illustrated in FIG. 1, may further include first and second auxiliary short-circuit portions 888LL and 888RR. The first auxiliary short-circuit portion 888LL is disposed more adjacent to an upper left corner of the first substrate 301 than the first outermost short-circuit portion 888L' of the first short-circuit portion unit 561 is thereto, and the second auxiliary short-circuit portion 888RR is disposed more adjacent to an upper right corner of the first substrate 301 than the second outermost short-circuit portion 888R' of the first short-circuit portion unit 561 is thereto.

The first auxiliary short-circuit portion 888LL may have a contact surface having substantially a same size as a size of the contact surface of the first outermost short-circuit portion 888L' of the first short-circuit portion unit 561, and the second auxiliary short-circuit portion 888RR may have a contact surface having substantially a same size as a size of the contact surface of the second outermost short-circuit portion 888R' of the first short-circuit portion unit 561.

In an exemplary embodiment, the first outermost short-circuit portion 888L' of the first short-circuit portion unit 561 may be transferred to a position of the first auxiliary short-circuit portion 888LL, and the second outermost short-circuit portion 888R' of the first short-circuit portion unit 561 may be transferred to a position of the second auxiliary short-circuit portion 888RR. In such an exemplary embodiment, the first and second auxiliary short-circuit portions 888LL and 888RR may be omitted.

In a case where the aforementioned contact surface of the short-circuit portion 888 is redefined as a first contact surface of the short-circuit portion 888 and a portion of the short-circuit portion 888 contacting the common electrode 330 is defined as a second contact surface of the short-circuit portion 888, a second contact surface of one of the plurality of short-circuit portions 888 that is adjacent to a corner of the first substrate 301 may have a different size from sizes of second contact surfaces of the other short-circuit portions. For example, a second contact surface of one of the plurality of short-circuit portions 888 that is adjacent to each corner of the first substrate 301 may be larger than second contact surfaces of the other short-circuit portions. In other words, the second contact surface of the outermost short-circuit portion may have a larger size than sizes of second contact surfaces of the other short-circuit portions. As such, respective second contact surfaces of the short-circuit portions may have substantially the same characteristics as those of the first contact surfaces (i.e., the contact surface) of the short-circuit portions.

The short-circuit portion 888 may include or be formed of silver (Ag). For example, the short-circuit portion 888 may include Ag.

As illustrated in FIG. 2, a sealing portion 155 is disposed in the non-display area AR2. The sealing portion 155 surrounds the display area AR1. The sealing portion 155 may overlap a portion of the short-circuit portion 888. The sealing portion 155 is disposed along the common line 166 on the first substrate 301. In addition, the sealing portion 155 intersects respective extension portions of the data lines DL1 to DLj. The sealing portion 155 may have a closed-loop shape.

Figure 3:
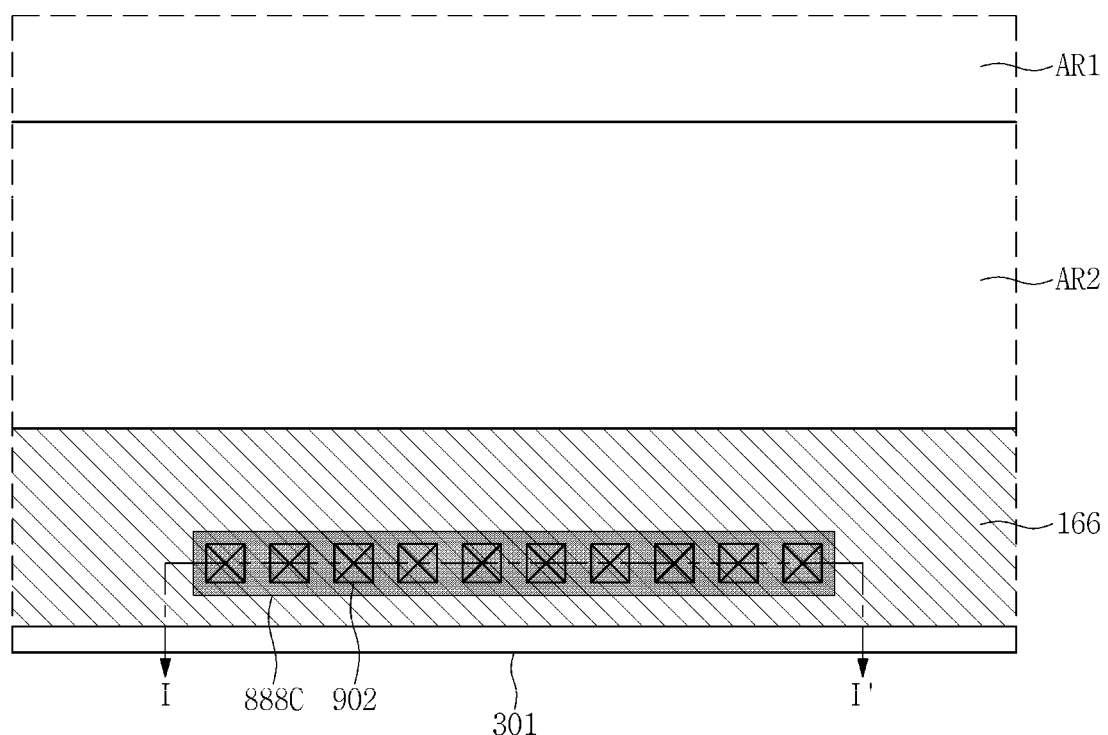
FIG. 3 is a plan view illustrating one short-circuit portion, except outermost short-circuit portions, among short-circuit portions included in a second short-circuit portion unit of FIG. 2, and the vicinity of the one short-circuit portion.
Figure 4:
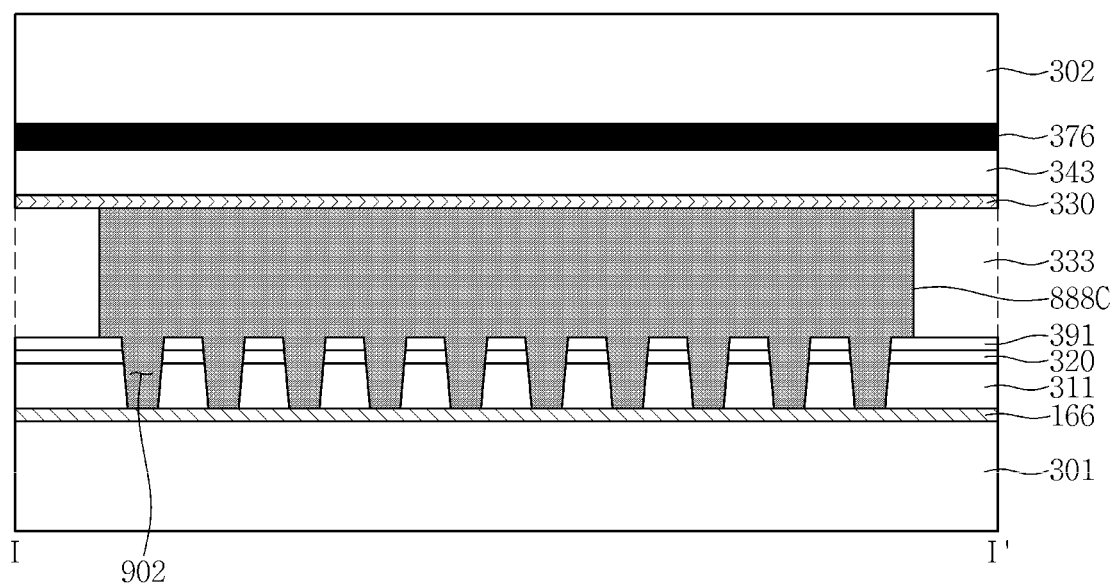
FIG. 4 is a cross-sectional view taken along line I-I' of FIG. 3.

FIG. 3 is a plan view illustrating one short-circuit portion, except the outermost short-circuit portions, among the short-circuit portions included in the second short-circuit portion unit of FIG. 2, and the vicinity of the one short-circuit portion, and FIG. 4 is a cross-sectional view taken along line I-I' of FIG. 3.

As illustrated in FIGS. 3 and 4, the short-circuit portion 888C may contact the common line 166 through the at least one common contact hole 902. For example, the short-circuit portion 888C may contact the common line 166 through ten common contact holes 902. A size of the contact surface of the short-circuit portion 888C may be proportional to the number and size of the common contact hole 902.

A side of the display area AR1 illustrated in FIG. 3 is represented by a solid line, which is dissimilar to that illustrated in FIG. 1, to facilitate identification of the side of the display area AR1 and an outer dotted line around the side of the display area AR1 in FIG. 3.

Figure 5:
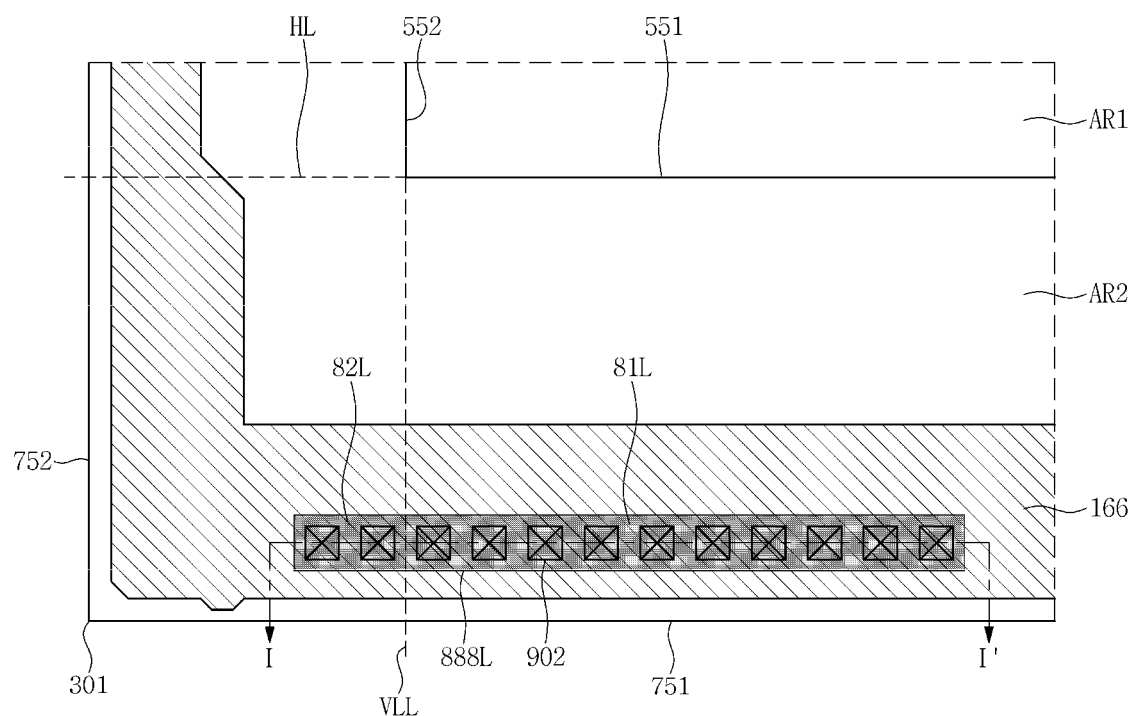
FIG. 5 is a plan view illustrating an exemplary embodiment of a first outermost short-circuit portion of FIG. 2 and the vicinity of the first outermost short-circuit portion.
Figure 6:
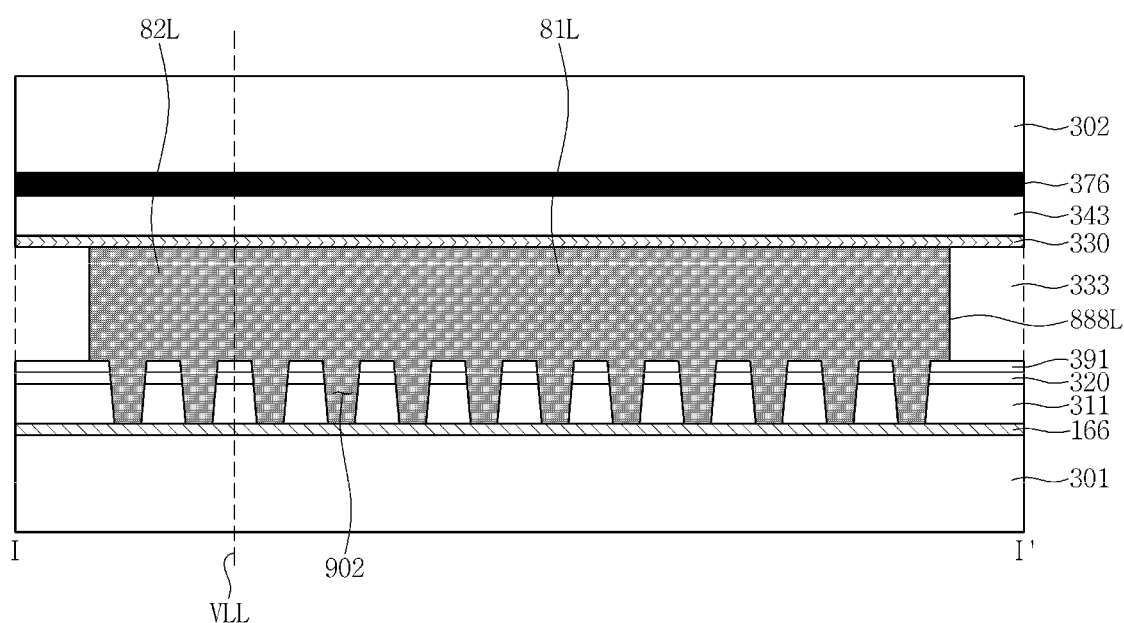
FIG. 6 is a cross-sectional view taken along line I-I' of FIG. 5.

FIG. 5 is a plan view illustrating an exemplary embodiment of the first outermost short-circuit portion of FIG. 2 and the vicinity of the first outermost short-circuit portion, and FIG. 6 is a cross-sectional view taken along line I-I' of FIG. 5;

As illustrated in FIGS. 5 and 6, the first outermost short-circuit portion 888L may contact the common line 166 through the at least one common contact hole 902. For example, the first outermost short-circuit portion 888L may contact the common line 166 through twelve common contact holes 902. A size of the contact surface of the first outermost short-circuit portion 888L may be proportional to the number and size of the common contact hole 902.

A side of the display area AR1 illustrated in FIG. 5 is represented by a solid line, which is dissimilar to that illustrated in FIG. 1, to facilitate identification of the side of the display area AR1 and an outer dotted line around the side of the display area AR1 in FIG. 5.

In a case where a size of the common contact hole 902, illustrated in FIG. 3, which is defined between the short-circuit portion 888C and the common line 166 is substantially the same as a size of a common contact hole 902, illustrated in FIG. 5, which is defined between the first outermost short-circuit portion 888L and the common line 166, the first outermost short-circuit portion 888L which is connected to the common line 166 through relatively a greater number of common contact holes 902 has a larger contact surface than a contact surface of the short-circuit portion 888C.

In an exemplary embodiment, as illustrated in FIG. 5, the first outermost short-circuit portion 888L may intersect a first extension line VLL. The first extension line VLL is an imaginary line extending from a side (hereinafter, a left side 552 of the display area AR1) of four sides that define the display area AR1. The left side 552 of the display area AR1 faces a left side 752 of the first substrate 301. The first extension line VLL intersects a lower side 751 of the first substrate 301.

The first outermost short-circuit portion 888L may include a first contact portion 81L and a second contact portion 82L. For example, the first outermost short-circuit portion 888L may be divided into two portions by the aforementioned first extension line VLL, and in such an exemplary embodiment, a right portion with respect to the first extension line VLL corresponds to the first contact portion 81L, and a left portion with respect to the first extension line VLL corresponds to the second contact portion 82L.

As illustrated in FIG. 5, the first contact portion 81L is disposed between a lower side 551 of the display area AR1 and the lower side 751 of the first substrate 301. In such an exemplary embodiment, the first contact portion 81L may have a contact surface having substantially a same size as a size of a contact surface of one short-circuit portion (e.g., a short-circuit portion 888C) of the other short-circuit portions.

As illustrated in FIG. 5, the second contact portion 82L is disposed in an area defined by being surrounded by the first extension line VLL, a second extension line HL, the lower side 751 of the first substrate 301, and the left side 752 of the first substrate 301. In the aforementioned area, the second contact portion 82L may be disposed more adjacent to the lower side 751 of the first substrate 301 than to the second extension line HL. The second extension line HL is an imaginary line extending from another side (i.e., the lower side 551) of the four sides that define the display area AR1.

Figure 7:
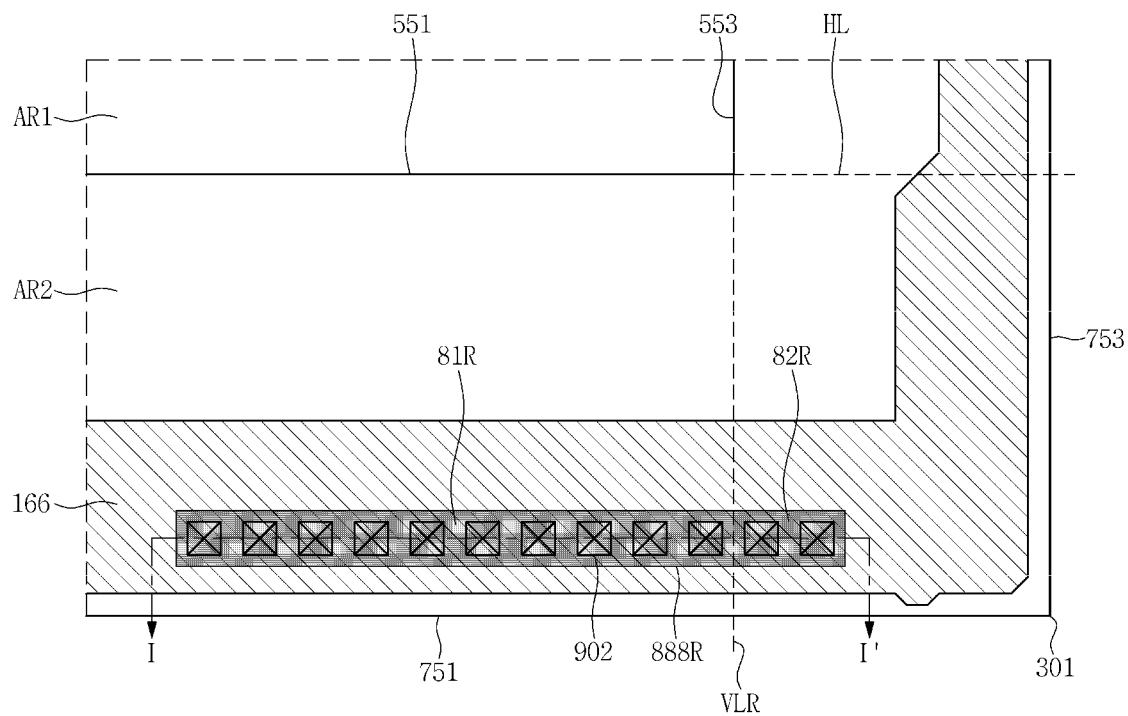
FIG. 7 is a plan view illustrating an exemplary embodiment of a second outermost short-circuit portion of FIG. 2 and the vicinity of the second outermost short-circuit portion.
Figure 8:
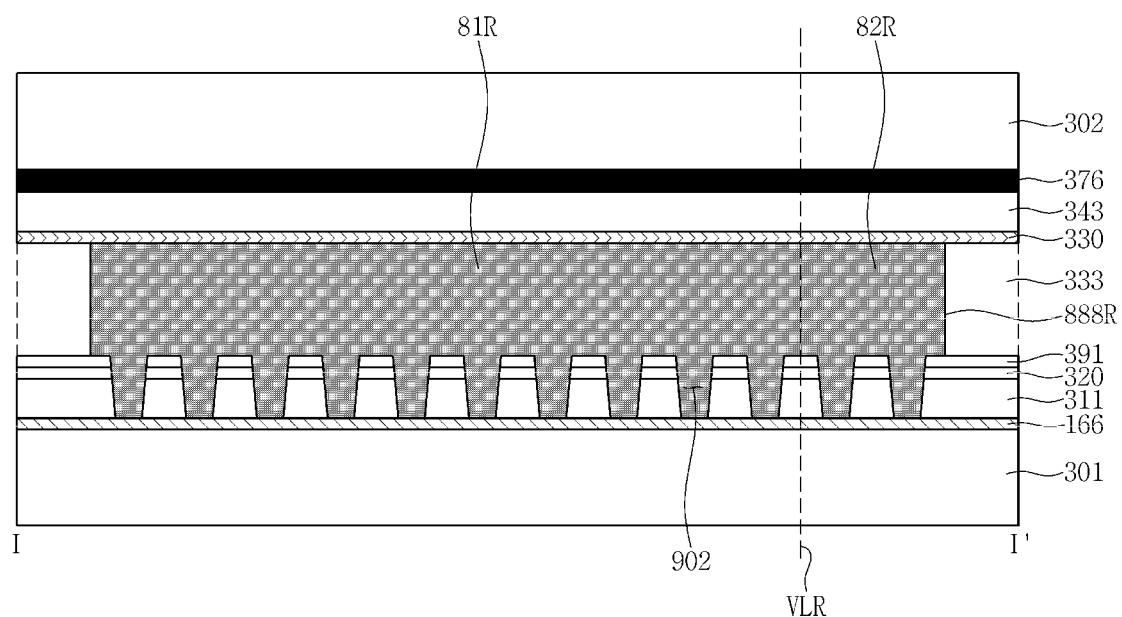
FIG. 8 is a cross-sectional view taken along line I-I' of FIG. 7.

FIG. 7 is a plan view illustrating an exemplary embodiment of the second outermost short-circuit portion of FIG. 2 and the vicinity of the second outermost short-circuit portion, and FIG. 8 is a cross-sectional view taken along line I-I' of FIG. 7.

As illustrated in FIGS. 7 and 8, the second outermost short-circuit portion 888R may contact the common line 166 through the at least one common contact hole 902. For example, the second outermost short-circuit portion 888R may contact the common line 166 through twelve common contact holes 902. A size of the contact surface of the second outermost short-circuit portion 888R may be proportional to the number and size of the common contact hole 902.

A side of the display area AR1 illustrated in FIG. 7 is represented by a solid line, which is dissimilar to that illustrated in FIG. 1, to facilitate identification of the side of the display area AR1 and an outer dotted line around the side of the display area AR1 in FIG. 7.

In a case where a size of the common contact hole 902, illustrated in FIG. 3, which is defined between the short-circuit portion 888C and the common line 166 is substantially the same as a size of a common contact hole 902, illustrated in FIG. 7, which is defined between the second outermost short-circuit portion 888R and the common line 166, the second outermost short-circuit portion 888R connected to the common line 166 through relatively a greater number of common contact holes 902 has a larger contact surface than a contact surface of the short-circuit portion 888C.

In an exemplary embodiment, as illustrated in FIG. 7, the second outermost short-circuit portion 888R may intersect a third extension line VLR. The third extension line VLR is an imaginary line extending from a side (hereinafter, a right side 553 of the display area AR1) of the four sides that define the display area AR1. The right side 553 of the display area AR1 faces a right side 753 of the first substrate 301. The third extension line VLR intersects the lower side 751 of the first substrate 301. The third extension line VLR is substantially parallel to the first extension line VLL.

The second outermost short-circuit portion 888R may include a first contact portion 81R and a second contact portion 82R. For example, the second outermost short-circuit portion 888R may be divided into two portions by the aforementioned third extension line VLR, and in such an exemplary embodiment, a left portion with respect to the third extension line VLR corresponds to the first contact portion 81R, and a right portion with respect to the third extension line VLR corresponds to the second contact portion 82R.

As illustrated in FIG. 7, the first contact portion 81R is disposed between the lower side 551 of the display area AR1 and the lower side 751 of the first substrate 301. In such an exemplary embodiment, the first contact portion 81R may have a contact surface having substantially a same size as a size of a contact surface of one short-circuit portion (e.g., a short-circuit portion 888C) of the other short-circuit portions.

As illustrated in FIG. 7, the second contact portion 82R is disposed in an area defined by being surrounded by the third extension line VLR, the second extension line HL, the lower side 751 of the first substrate 301, and the right side 753 of the first substrate 301. In the above-described area, the second contact portion 82R may be disposed more adjacent to the lower side 751 of the first substrate 301 than to the second extension line HL.

Figure 9:
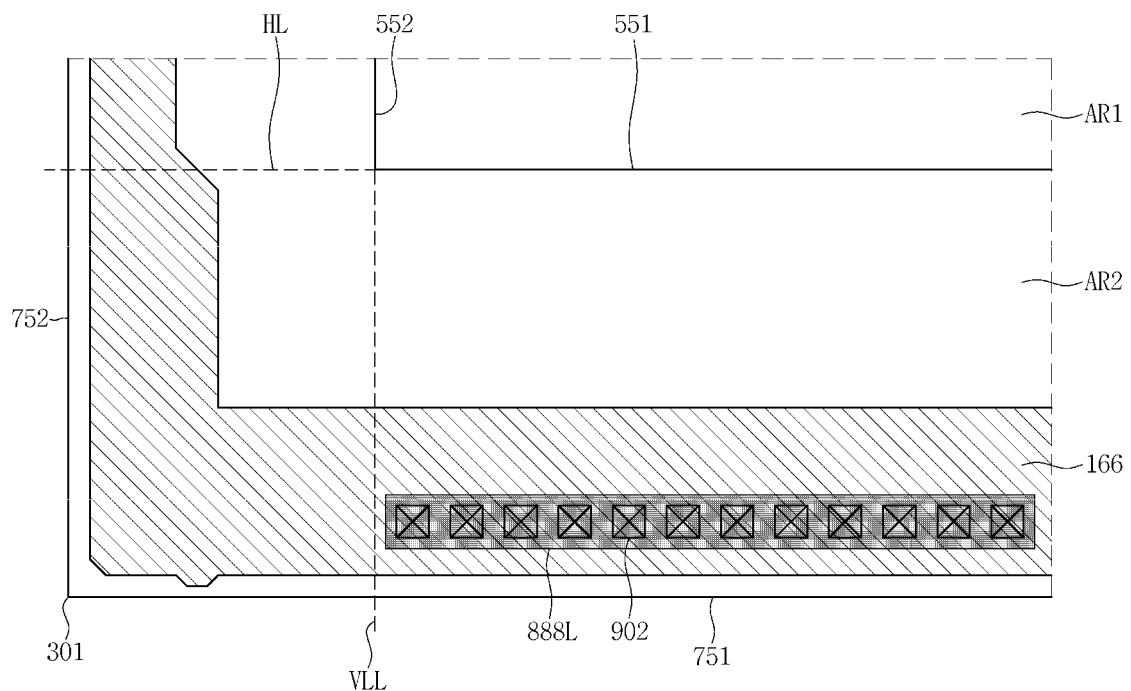
FIG. 9 is a plan view illustrating an alternative exemplary embodiment of the first outermost short-circuit portion of FIG. 2 and the vicinity of the first outermost short-circuit portion.
Figure 10:
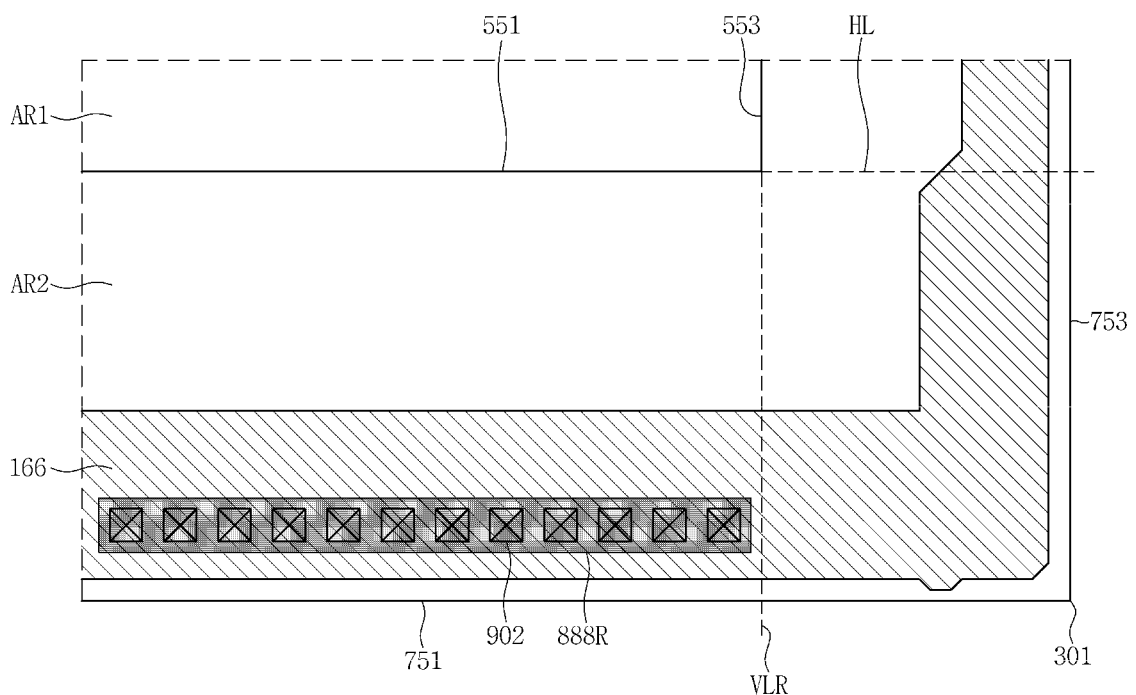
FIG. 10 is a plan view illustrating an alternative exemplary embodiment of the second outermost short-circuit portion of FIG. 2 and the vicinity of the second outermost short-circuit portion.

FIG. 9 is a plan view illustrating an alternative exemplary embodiment of the first outermost short-circuit portion of FIG. 2 and the vicinity of the first outermost short-circuit portion, and FIG. 10 is a plan view illustrating an alternative exemplary embodiment of the second outermost short-circuit portion of FIG. 2 and the vicinity of the second outermost short-circuit portion.

A side of the display area AR1 illustrated in FIGS. 9 and 10 is represented by a solid line, which is dissimilar to that illustrated in FIG. 1, to facilitate identification of the side of the display area AR1 and an outer dotted line around the side of the display area AR1 in FIGS. 9 and 10.

As illustrated in FIG. 9, the first outermost short-circuit portion 888L is disposed between the lower side 551 of the display area AR1 and the lower side 751 of the first substrate 301.

As illustrated in FIG. 10, the second outermost short-circuit portion 888R is disposed between the lower side 551 of the display area AR1 and the lower side 751 of the first substrate 301.

In other words, the first outermost short-circuit portion 888L and the second outermost short-circuit portion 888R may be disposed in an area defined by being surrounded by the lower side 551 of the display area AR1, the lower side 751 of the first substrate 301, the first extension line VLL, and the third extension line VLR.

Figure 11:
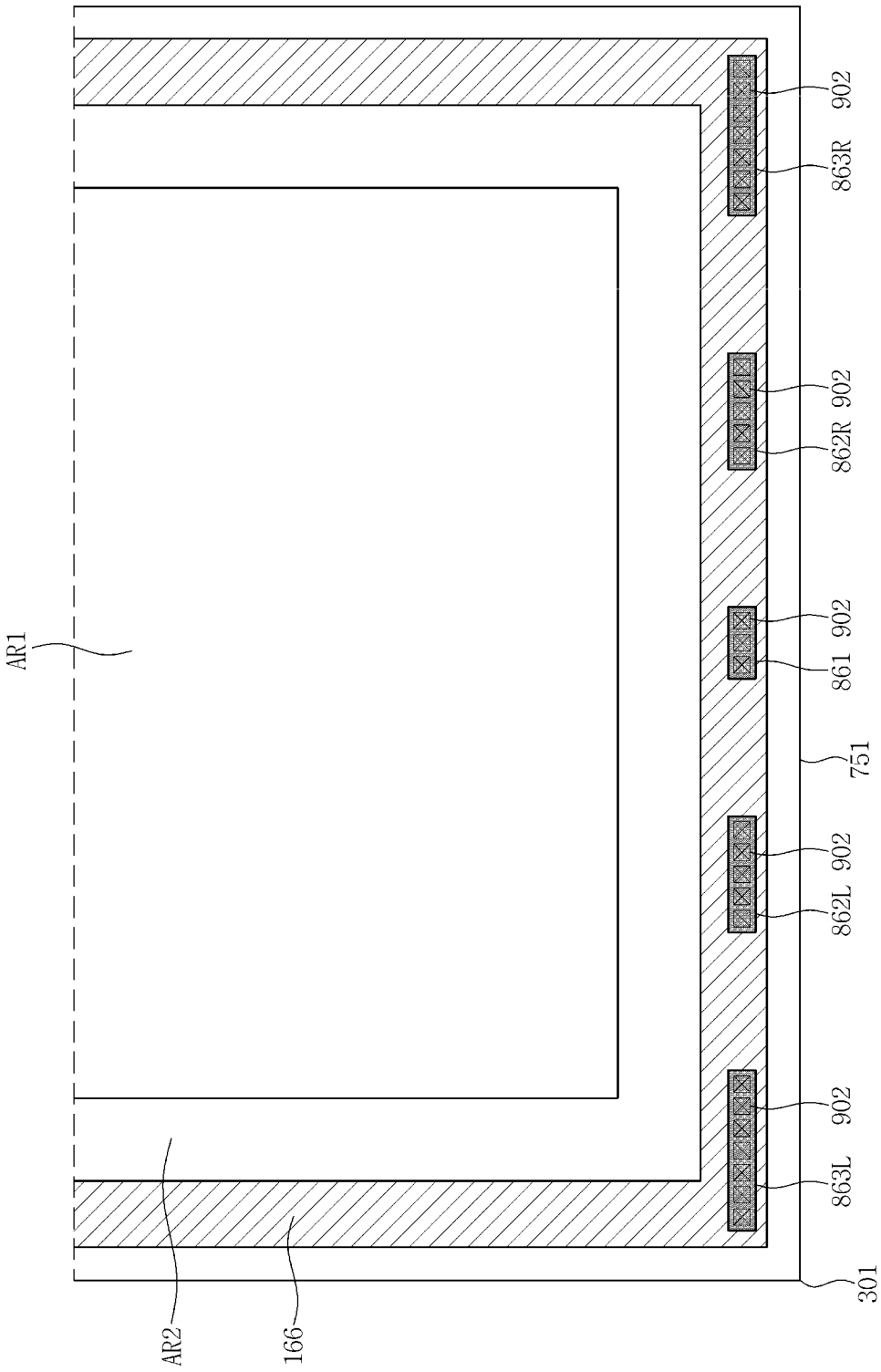
FIG. 11 is a view illustrating an alternative exemplary embodiment of an LCD device.

FIG. 11 is a view illustrating an alternative exemplary embodiment of an LCD device.

As illustrated in FIG. 11, short-circuit portions 861, 862L, 863L, 862R, and 863R of the second short-circuit portion unit 562 may have a larger contact surface, as more adjacent to opposite end portions of the lower side 751 of the first substrate 301. In other words, the short-circuit portions 861, 862L, 863L, 862R, and 863R of the second short-circuit portion unit 562 may have a larger contact surface, as more adjacent to a corner of the first substrate 301.

For example, five short-circuit portions 861, 862L, 863L, 862R, and 863R are illustrated in FIG. 11. Among the five short-circuit portions 861, 862L, 863L, 862R, and 863R, a short-circuit portion (hereinafter, a first outermost short-circuit portion 863L) most adjacent to a left end portion of the lower side 751 and a short-circuit portion (hereinafter, a second outermost short-circuit portion 863R) most adjacent to a right end portion of the lower side 751 have larger contact surfaces than contact surfaces of the other short-circuit portions 861, 862L, and 862R. In addition, although not illustrated, the first outermost short-circuit portion 863L and the second outermost short-circuit portion 863R may have larger contact surfaces than contact surfaces of the short-circuit portions 888 of the first short-circuit portion unit 561.

The first outermost short-circuit portion 863L and the second outermost short-circuit portion 863R may have contact surfaces of substantially a same size.

As illustrated in FIG. 5, the first outermost short-circuit portion 863L may intersect the first extension line VLL. In an alternative exemplary embodiment, as illustrated in FIG. 9, the first outermost short-circuit portion 863L may be disposed between the lower side 551 of the display area AR1 and the lower side 751 of the first substrate 301.

As illustrated in FIG. 7, the second outermost short-circuit portion 863R may intersect the second extension line VLR. In an alternative exemplary embodiment, as illustrated in FIG. 10, the second outermost short-circuit portion 863R may be disposed between the lower side 551 of the display area AR1 and the lower side 751 of the first substrate 301.

A short-circuit portion (hereinafter, a central short-circuit portion 861) at a central portion of the lower side 751 may have a smallest contact surface among contact surfaces of the five short-circuit portions 861, 862L, 863L, 862R, and 863R.

The short-circuit portion 862L between the central short-circuit portion 861 and the first outermost short-circuit portion 863L has a contact surface larger than that of the central short-circuit portion 861 and less than that of the first outermost short-circuit portion 863L.

The short-circuit portion 862R between the central short-circuit portion 861 and the second outermost short-circuit portion 863R has a contact surface larger than that of the central short-circuit portion 861 and less than that of the second outermost short-circuit portion 863R.

Although not illustrated, the short-circuit portions 888 of the first short-circuit portion unit 561 may have a larger contact surface, as disposed more adjacent to opposite end portions of the upper side (the upper side of the first substrate 301).

Each corner portion of the first substrate 301, e.g., opposite edges of the lower side (i.e., opposite corners of the lower side of the first substrate), is a portion to which a greatest portion of electrostatic discharge ("ESD") flows. An exemplary embodiment of an LCD device includes the first substrate 301 on which the common line 166 and the plurality of short-circuit portions 888 contacting the common line 166 are disposed, and the outermost short-circuit portions, at each corner of the first substrate 301, among the plurality of short-circuit portions 888, have a larger contact surface than contact surfaces of the other short-circuit portions among the plurality of short-circuit portions 888.

Accordingly, ESD applied to the LCD device may be readily discharged externally through the outermost short-circuit portions.

As set forth above, according to one or more exemplary embodiments, an LCD device may provide the following effects.

An exemplary embodiment of an LCD device includes a first substrate on which a common line and a plurality of short-circuit portions contacting the common line are disposed, and outermost short-circuit portions at opposite corners of a lower side of the first substrate among the plurality of short-circuit portions have larger contact surfaces than contact surfaces of other short-circuit portions of the plurality of short-circuit portions. Accordingly, ESD applied to the LCD device may be readily discharged externally through the outermost short-circuit portions. Accordingly, damage to, for example, switching elements by ESD may be effectively reduced.

From the foregoing, it will be appreciated that various embodiments in accordance with the present disclosure have been described herein for purposes of illustration, and that various modifications may be made without departing from the scope and spirit of the present teachings. Accordingly, the various embodiments disclosed herein are not intended to be limiting of the true scope and spirit of the present teachings. Various features of the above described and other embodiments can be mixed and matched in any manner, to produce further embodiments consistent with the invention.

What is claimed is:

1. A liquid crystal display device comprising:
a first substrate and a second substrate spaced apart from each other;
a liquid crystal layer between the first substrate and the second substrate;
a common line on the first substrate;
a common electrode on the second substrate; and
a plurality of short-circuit portions between the common line and the common electrode, the plurality of short-circuit portions being disposed along a line disposed in a non-display area of the first substrate not to cross a display area of the first substrate,
wherein at least two of the short-circuit portions have different sizes.

2. The liquid crystal display device as claimed in claim 1, wherein the at least two of the short-circuit portions have different sizes along the line.

3. The liquid crystal display device as claimed in claim 1, wherein a short-circuit portion proximate to a corner of the first substrate has a different size from another short-circuit portion.

4. The liquid crystal display device as claimed in claim 3, wherein the short-circuit portion proximate to the corner of the first substrate has a greater size than another short-circuit portion.

5. The liquid crystal display device as claimed in claim 1, further comprising an insulating layer between the plurality of short-circuit portions and the common line, the insulating layer having contact holes for connecting the plurality of short-circuit portions and the common line.

6. A liquid crystal display device comprising:
a first substrate and a second substrate spaced apart from each other;
a liquid crystal layer between the first substrate and the second substrate;
a common line on the first substrate;
a common electrode on the second substrate;
a plurality of short-circuit portions between the common line and the common electrode, the plurality of short-circuit portions being disposed along a direction, and
an insulating layer between the plurality of short-circuit portions and the common line, the insulating layer having contact holes for connecting the plurality of short-circuit portions and the common line,
wherein at least two of the short-circuit portions have different sizes, and
wherein the at least two of the short-circuit portions are connected to the common line through different numbers of the contact holes, respectively.

7. The liquid crystal display device as claimed in claim 6, wherein the short-circuit portion proximate to a corner of the first substrate contacts the common line through a greater number of contact holes than a number of contact holes through which another short-circuit portion contacts the common line.

8. The liquid crystal display device as claimed in claim 1, wherein the plurality of short-circuit portions have greater sizes as closer to at least one of edges of the first substrate, the edges facing each other along the line.

9. The liquid crystal display device as claimed in claim 1, wherein one of two outermost short-circuit portions that are farthest from each other among the plurality of short-circuit portions intersects an imaginary first extension line extending from a first side of the display area of the first substrate.

10. The liquid crystal display device as claimed in claim 9, wherein another of the two outermost short-circuit portions intersects an imaginary second extension line extending from a second side of the display area, the first and second sides facing each other along the line.

11. The liquid crystal display device as claimed in claim 1, wherein at least one of two outermost short-circuit portions that are farthest from each other among the plurality of short-circuit portions is disposed between first and second imaginary extension lines extending from first and second sides of the display area of the first substrate respectively, the first and second sides facing each other along the line.

12. The liquid crystal display device as claimed in claim 1, wherein each short-circuit portion of the plurality of short-circuit portions comprises a contact surface contacting the common line, and at least two of the short-circuit portions comprise contact surfaces having different sizes.

13. The liquid crystal display device as claimed in claim 12, wherein a short-circuit portion proximate to a corner of the first substrate comprises a contact surface having a different size from another short-circuit portion.

14. The liquid crystal display device as claimed in claim 13, wherein the short-circuit portion proximate to the corner of the first substrate comprises a contact surface having a larger size than another short-circuit portion.

15. A liquid crystal display device comprising:
a first substrate and a second substrate spaced apart from each other with a liquid crystal layer disposed therebetween;
a common line disposed on the first substrate;
a common electrode disposed on the second substrate; and
a plurality of first short-circuit portions disposed between the first substrate and the second substrate, and connecting the common line and the common electrode, the plurality of first short-circuit portions being disposed along a line disposed in a non-display area of the first substrate not to cross a display area of the first substrate and one side of the first substrate, wherein each short-circuit portion of the plurality of first short-circuit portions includes a contact surface contacting the common line, and wherein contact surfaces disposed adjacent to each other have different sizes.

16. The liquid crystal display device as claimed in claim 15, wherein a first short-circuit portion disposed proximate to one corner of the first substrate includes a contact surface having a size different from a size of a contact surface of another first short-circuit portion.

17. The liquid crystal display device as claimed in claim 16, wherein the first short-circuit portion disposed proximate to the one corner of the first substrate has a contact surface greater than that of a first short-circuit portion disposed at a center region of the first substrate.

18. A liquid crystal display device comprising:

a first substrate and a second substrate spaced apart from each other with a liquid crystal layer disposed therebetween;

a common line disposed on the first substrate;

a common electrode disposed on the second substrate; and a plurality of first short-circuit portions disposed between the first substrate and the second substrate, and connecting the common line and the common electrode, the plurality of first short circuit portions being disposed along one side of the first substrate, wherein each short-circuit portion of the plurality of first short-circuit portions includes a contact surface contacting the common line, wherein contact surfaces disposed adjacent to each other have different sizes, wherein a first short-circuit portion disposed proximate to one corner of the first substrate includes a contact surface having a size different from a size of a contact surface of another first short-circuit portion, wherein the first short-circuit portion disposed proximate to the one corner of the first substrate has a contact surface greater than that of a first short-circuit portion disposed at a center region of the first substrate, and wherein a first short-circuit portion disposed between the first short-circuit portion disposed proximate to the one corner of the first substrate and the first short-circuit portion disposed at the center region of the first substrate has a contact surface greater than the contact surface of the first short-circuit portion disposed at the center region of the first substrate and smaller than the contact surface of the first short-circuit portion disposed proximate to the one corner of the first substrate.

19. The liquid crystal display device as claimed in claim 18, wherein a first short-circuit portion disposed proximate to another corner of the first substrate has a contact surface greater than that of the first short-circuit portion disposed at the center region of the first substrate.

20. The liquid crystal display device as claimed in claim 19, wherein a first short-circuit portion disposed between the first short-circuit portion disposed proximate to the another corner of the first substrate and the first short-circuit portion disposed at the center region of the first substrate has a contact surface greater than the contact surface of the first short-circuit portion disposed at the center region of the first substrate and smaller than the contact surface of the first short-circuit portion disposed proximate to the another corner of the first substrate.

21. The liquid crystal display device as claimed in claim 20, further comprising a plurality of second short-circuit portions disposed along another side of the first substrate which faces the one side of the first substrate, wherein second short circuit portions disposed proximate to opposite corners of the one corner and the another corner have a contact surface greater than a contact surface of a second short circuit portions disposed between the second short circuit portions disposed proximate to opposite corners.

22. The liquid crystal display device as claimed in claim 21, further comprising a first auxiliary short-circuit portion and a second auxiliary short-circuit portion disposed adjacent to the second short circuit portions disposed proximate to opposite corners of the first substrate, respectively, wherein contact surfaces of the first auxiliary short-circuit portion and the second auxiliary short-circuit portion have substantially a same size as the contact surface of the second short-circuit portions disposed proximate to opposite corners.

23. A liquid crystal display device comprising:

a first substrate and a second substrate spaced apart from each other with a liquid crystal layer disposed therebetween;

a common line disposed on the first substrate;

a common electrode disposed on the second substrate;

a plurality of first short-circuit portions disposed between the first substrate and the second substrate, and connecting the common line and the common electrode, the plurality of first short circuit portions being disposed along one side of the first substrate; and an insulating layer disposed on the common line, wherein each short-circuit portion of the plurality of first short-circuit portions includes a contact surface contacting the common line, wherein contact surfaces disposed adjacent to each other have different sizes, wherein the insulating layer has a plurality of contact holes through which the plurality of first short-circuit portions and the common line are connected, and wherein first short-circuit portions disposed adjacent to each other have different numbers of contact holes.

24. The liquid crystal display device as claimed in claim 23, wherein a first short-circuit portion disposed proximate to one corner of the first substrate including a number of contact holes different from a number of contact holes of another first short-circuit portion.

25. The liquid crystal display device as claimed in claim 24, wherein the first short-circuit portion disposed proximate to the one corner of the first substrate has a number of contact holes greater than those of a first short-circuit portion disposed at a center region of the first substrate.

26. The liquid crystal display device as claimed in claim 25, wherein a first short-circuit portion disposed between the first short-circuit portion disposed proximate to the one corner of the first substrate and the first short-circuit portion disposed at the center region of the first substrate has a number of contact holes greater than those of the first short-circuit portion disposed at the center region of the first substrate and smaller than those of the first short-circuit portion disposed proximate to the one corner of the first substrate.

27. The liquid crystal display device as claimed in claim 24,
wherein the first short-circuit portion disposed proximate to another corner has a number of contact holes greater than those of a first short-circuit portion disposed at a center region of the first substrate.

28. The liquid crystal display device as claimed in claim 27,
wherein a first short-circuit portion disposed between the first short-circuit portion disposed proximate to the another corner of the first substrate and the first short-circuit portion disposed at the center region of the first substrate has a number of contact holes greater than those of the first short-circuit portion disposed at the center region of the first substrate and smaller than those of the first short-circuit portion disposed proximate to the another corner of the first substrate.

29. The liquid crystal display device as claimed in claim 28, further comprising a plurality of second short-circuit portions disposed along another side of the first substrate which faces the one side of the first substrate,
wherein second short-circuit portions disposed proximate to opposite corners of the one corner and the another corner have a number of contact holes greater than a number of contact holes of a second short circuit portions disposed between the second short circuit portions disposed proximate to opposite corners.

30. The liquid crystal display device as claimed in claim 29, further comprising a first auxiliary short-circuit portion and a second auxiliary short-circuit portion disposed adjacent to the second short circuit portions disposed proximate to opposite corners of the first substrate, respectively,
wherein contact surfaces of the first auxiliary short-circuit portion and the second auxiliary short-circuit portion have substantially a same size as the contact surface of the second short-circuit portions disposed proximate to opposite corners.

* * * * *